(12) United States Patent
Tate

(10) Patent No.: US 6,352,437 B1
(45) Date of Patent: Mar. 5, 2002

(54) SOLDER BALL TERMINAL

(76) Inventor: John O. Tate, 9 Morgan Ct., Lincoln, RI (US) 02865

( * ) Notice: Subject to any disclaimer, the term of this patent is extended or adjusted under 35 U.S.C. 154(b) by 0 days.

(21) Appl. No.: 09/420,711

(22) Filed: Oct. 20, 1999

(51) Int. Cl.[7] ................................. H01R 9/09
(52) U.S. Cl. ........................................ 439/83
(58) Field of Search ..................... 439/83, 876, 70, 439/63; 228/180.22; 361/767

(56) References Cited

U.S. PATENT DOCUMENTS

| | | | |
|---|---|---|---|
| 3,780,433 A | 12/1973 | Lynch | |
| 4,767,344 A | 8/1988 | Noschese | |
| 4,802,862 A | 2/1989 | Seidler | |
| 4,883,435 A | 11/1989 | Seidler | |
| 5,030,144 A | 7/1991 | Seidler | |
| 5,514,907 A | * 5/1996 | Moshayeedi | 439/83 |
| 5,593,322 A | 1/1997 | Swamy et al. | |
| 5,636,104 A | 6/1997 | Oh | |
| 5,875,102 A | 2/1999 | Barrow | |
| 5,877,554 A | 3/1999 | Murphy | |
| 5,984,694 A | * 11/1999 | Sinclair | 439/70 |
| 5,989,049 A | * 11/1999 | Walkup et al. | 439/342 |
| 6,007,348 A | * 12/1999 | Kurphy | 439/70 |
| 6,054,978 A | * 4/2000 | Perry | 345/163 |
| 6,059,172 A | * 5/2000 | Chapman et al. | 228/180.22 |
| 6,079,986 A | * 6/2000 | Beshears | 439/63 |

FOREIGN PATENT DOCUMENTS

| | | |
|---|---|---|
| EP | 0 753 990 | 1/1997 |
| GB | 2325354 | 11/1998 |
| JP | 1998 10255882 | 9/1998 |

* cited by examiner

*Primary Examiner*—Brian Sircus
*Assistant Examiner*—Phuong K T Dinh
(74) *Attorney, Agent, or Firm*—Salter & Michaelson

(57) ABSTRACT

A solder ball terminal includes a body portion, a spherical socket disposed at one end of the body portion, the spherical socket including an interior wall terminating in an annular lip, wherein the annular lip defines an opening of the spherical socket and a solder ball disposed within the socket such that a portion of the solder ball extends through the opening and beyond the annular lip.

2 Claims, 4 Drawing Sheets

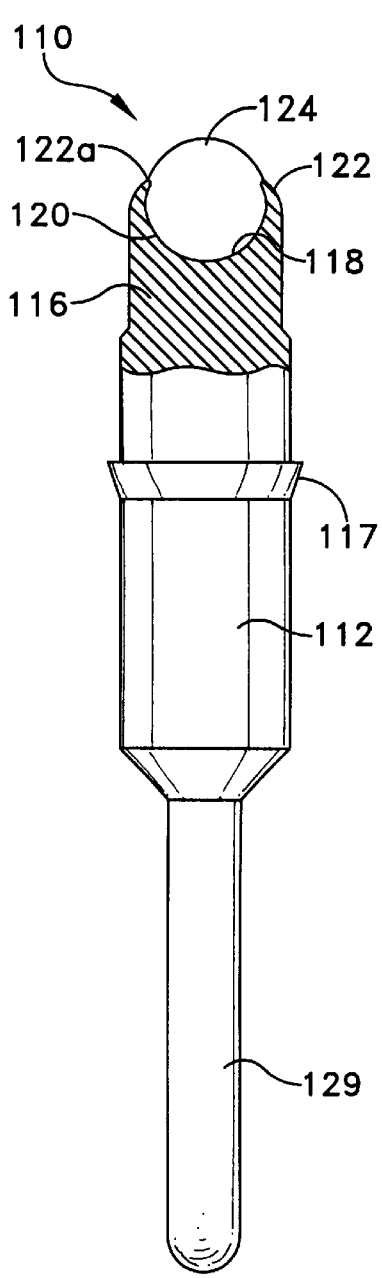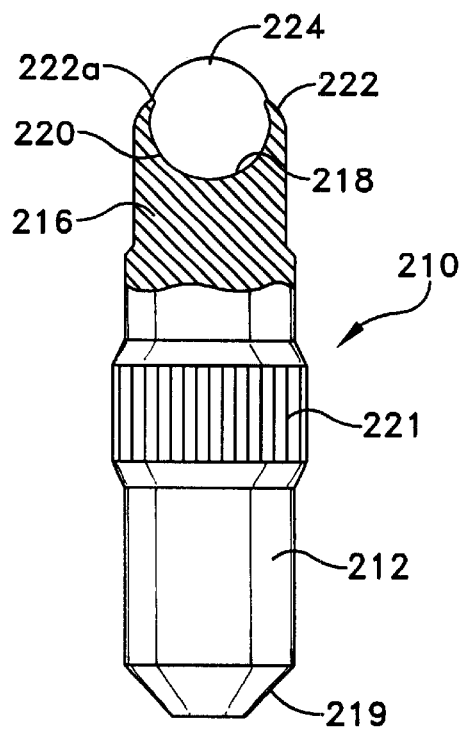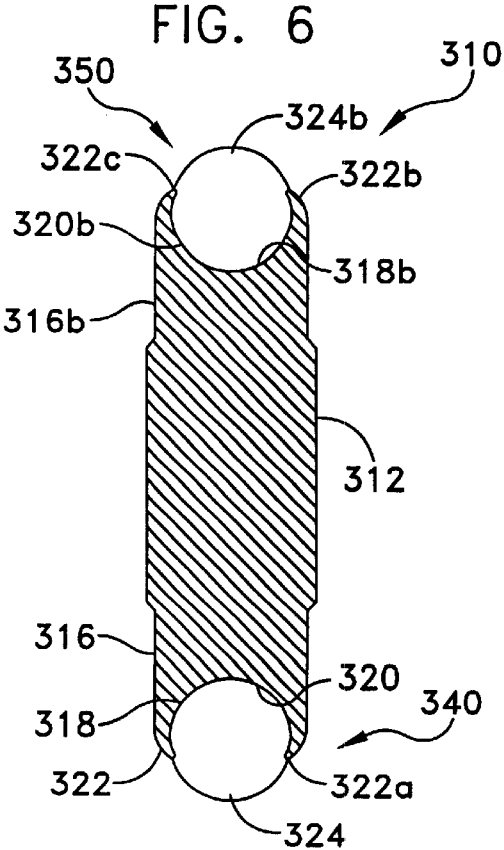
FIG. 5
FIG. 6
FIG. 7

SOLDER BALL TERMINAL

TECHNICAL FIELD

The present invention generally relates to electrical connectors and more particularly to a solder ball terminal which facilitates the connection of electrical leads to surface mount ball grid array devices, land grid array devices and board to board connections.

DISCUSSION OF THE RELATED ART

In the electronics equipment industry, it is known to provide leads for connection to contact pads of printed circuit boards and other substrates by soldering the leads thereto. However, as the electronics industry continues to move toward greater miniaturization, the size and spacing between the contact pads has accordingly been reduced. This requires a corresponding reduction in the size and spacing of the leads which are connected to contact pads. While the reduction of the spacing between the leads is advantageous from a space-conservation standpoint, it is important to provide sufficient spacing to prevent inadvertent contact between adjacent leads. It is likewise important to ensure that a connection is made between the leads and the contact pads.

Various prior art connection devices have been developed in order to facilitate the connection of high density pads. U.S. Pat. No. 5,030,144 to Seidler discloses a solder-bearing lead including a rectangular bar having a pair of prongs for receiving a solder mass therebetween. The bar is bent at a 90° angle so that the portion holding the solder mass is parallel to the mounting surface, and the opposite portion extends perpendicularly from the mounting surface. While this device may be effective in connecting terminals to the mounting surface, it has several drawbacks. For instance, due to the offset design, the alignment of the connector is complicated and, once the connections are made, the offset connector can be difficult to design around. Furthermore, the offset design, in combination with the irregular shape of the solder mass, introduces the possibility that the mass could be misaligned with the mounting pad, since the parallel portion might not always be precisely parallel and since the solder mass may not fit precisely on or in the mounting pad.

A more precise method of connecting terminals to mounting pads involves a technology in which the mounting pads are arranged as a grid and a number of solder balls are used to connect the terminals to the mounting pads. The advantage of using this technology, which is called a ball grid array or BGA, is that the solder balls are configured to enable a more precise alignment of the terminal with the mounting pad because the initial contact point on the mounting pad is a round point on the surface of the solder ball, rather than a wider or irregularly-shaped portion of the solder mass described above. This more precise alignment capability enables the spacing between the terminals to be greatly minimized as compared to the device described above with respect to the '144 patent.

Conventional solder ball terminals are formed by elevating the temperature of a solder ball to just below the liquid state to cause the solder ball 524 to adhere to the end 522 of a metal terminal 510 (FIG. 8, prior art). Although generally effective, there are several disadvantages to conventional solder ball terminals. For example, the terminal can lack good mechanical security (and hence electrical continuity) since the solder ball can be prone to breaking off from the smooth, flat surface of the terminal. Also, the shape (i.e. roundness) of the solder ball can be affected during the attachment of the ball to the terminal which, in turn, can adversely affect attachment to the mounting pad.

Proper alignment of the solder ball to the terminal can likewise be compromised during the attachment procedure. Also, because the solder ball is attached to the end of the terminal, the distance between the terminal and the mounting pad prior to the application of heat to the solder ball is greater than the diameter of the solder ball, thus increasing the risk of the terminal becoming misaligned with the mounting pad while the solder ball is being liquefied. In addition, if the solder ball is not in contact with the mounting pad, then when heat is applied, the liquefied solder will flow toward the heat source, in this instance the terminal, instead of following the force of gravity toward the mounting pad. In such a case a proper connection to the pad is not made.

It is therefore an object of the present invention to provide a device which allows for precise alignment and placement of a solder ball in a predictable manner for facilitating the connection of electrical leads to a variety of devices, including surface mount ball grid array devices, land grid array devices, and board to board connections.

SUMMARY OF THE INVENTION

The present invention provides a solder ball terminal in which the solder ball is physically retained in a counterbored socket at a connection end of the terminal. The solder ball is configured such that less than half of the diameter of the ball is exposed from the terminal in order to minimize the distance between the end of the terminal and the mounting pad before heat is applied to the solder ball to effect the connection between the terminal and the mounting pad.

According to one embodiment of the invention, a solder ball terminal is disclosed which includes a body portion, a connection socket disposed at one end of the body portion, the socket including an interior wall terminating in an annular lip, wherein the annular lip defines an opening into the socket. The solder ball is disposed within the socket such that a portion of the solder ball which is less than half of the diameter of the solder ball, extends beyond the annular lip. In a preferred embodiment, the socket has a spherical shape, and a longitudinal axis of the terminal's body portion extends through a center point of the solder ball.

According to another embodiment of the present invention, a solder ball terminal for particular application in surface mount circuit board connections is disclosed. The terminal includes a body portion at a first end thereof and a head at a second end thereof, the head including a socket having an opening for receiving a solder ball such that a portion of the solder ball extends outwardly from the socket, beyond the opening. The body portion may also preferably include a male adaptor for connection to a second solder ball terminal.

BRIEF DESCRIPTION OF THE DRAWINGS

It should be understood that the drawings are provided for the purpose of illustration only and are not intended to define the limits of the invention. The foregoing and other objects and advantages of the embodiments described herein will become apparent with reference to the following detailed description when taken in conjunction with the drawings in which:

FIG. 5 is a partial cut-away view of an alternate embodiment of the solder ball terminal of FIG. 1, including a male adaptor at one end for connection to a socket;

FIG. 6 is a partial cut-away view of an alternate embodiment of the solder ball terminal of FIG. 1, including a closed end and a knurl;

FIG. 7 is a partial cut-away view of an alternate embodiment of the solder ball terminal of FIG. 1, including a pair of solder balls disposed within corresponding sockets at either end of the terminal.

DETAILED DESCRIPTION OF THE ILLUSTRATIVE EMBODIMENTS

Figure 1:
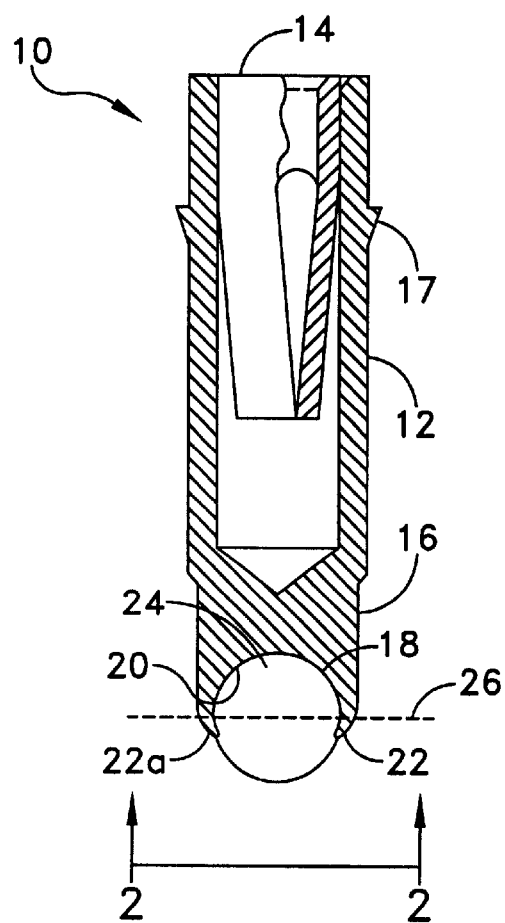
FIG. 1 is a partial cut-away view of the solder ball terminal of the present invention, the cut-away portion showing the configuration of the solder ball within the connection socket of the terminal.
Figure 2:
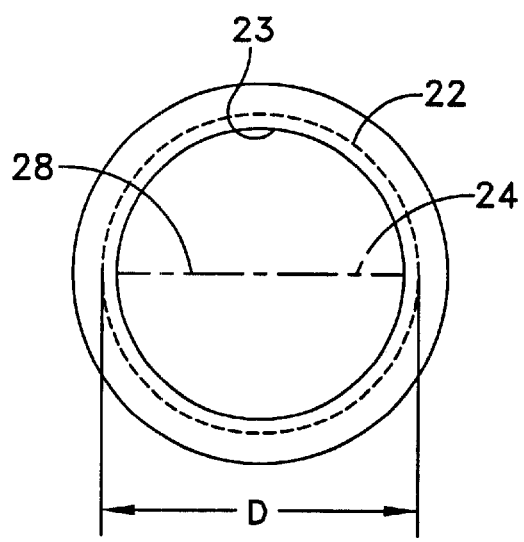
FIG. 2 is an end view of the solder ball terminal, as seen from line 2—2 in FIG. 1.

Referring now to the drawings, and more particularly FIGS. 1 and 2, there is generally indicated at 10 a solder ball terminal in accordance with the present invention. Solder ball terminal 10 includes a body portion 12 having a female socket 14 disposed at one end thereof and a head portion 16 disposed at an opposite end thereof. Preferably, the body 12, socket 14, and head 16 are formed from a unitary piece of metal.

Head 16 further includes a connection socket 18 which is defined internally by a wall 20, and which includes an annular lip 22 located at the distal end of the head 16. The socket 18 may preferably be spherical so that a solder ball 24 can be easily fitted or swadged into the socket 18. The solder ball 24 is formed from typical solder materials, such as tin and lead, and the diameter of the solder ball 24 is approximately 0.020"–0.030" in the present embodiment. It should be understood that any size solder ball may be used in conjunction with the present invention, provided that the spherical socket 18 is appropriately sized, as described below.

As seen in FIG. 2, the reduced-diameter opening defined by the outermost tip 22a of the annular lip 22, shown by dotted dashed line 28, is smaller than a first diameter "D" of the solder ball 24. This configuration allows the solder ball to be securely retained within the socket 18 by the annular lip so that the solder ball does not disengage from the socket. In addition, a center line which bisects the solder ball 24, shown by dashed line 26, is disposed within socket 18, above the outermost tip 22a of the annular lip 22. This enables more precise alignment of the solder ball 24 on a mounting pad by reducing the distance between the terminal and the mounting pad, as described in greater detail below.

Body 12 may also include a barb portion 17 for anchoring the terminal in an insulating mount, as is known in the art. In addition, connection socket 14 is preferably sized to receive an adapter or interposer from a second terminal for connection to both a circuit board and a microprocessor chip or for connection to electrical leads to the microprocessor. Such an adapter 129 is shown in FIG. 5 which represents an alternate embodiment of body portion 12, as described in greater detail below. Use of solder ball terminal 10 with connection socket 14 in combination with terminal 110 and adapter 129 allows a simultaneous connection to be made between a microprocessor chip and a printed circuit board which reduces cost and the risk of damage to the system.

Figure 3:
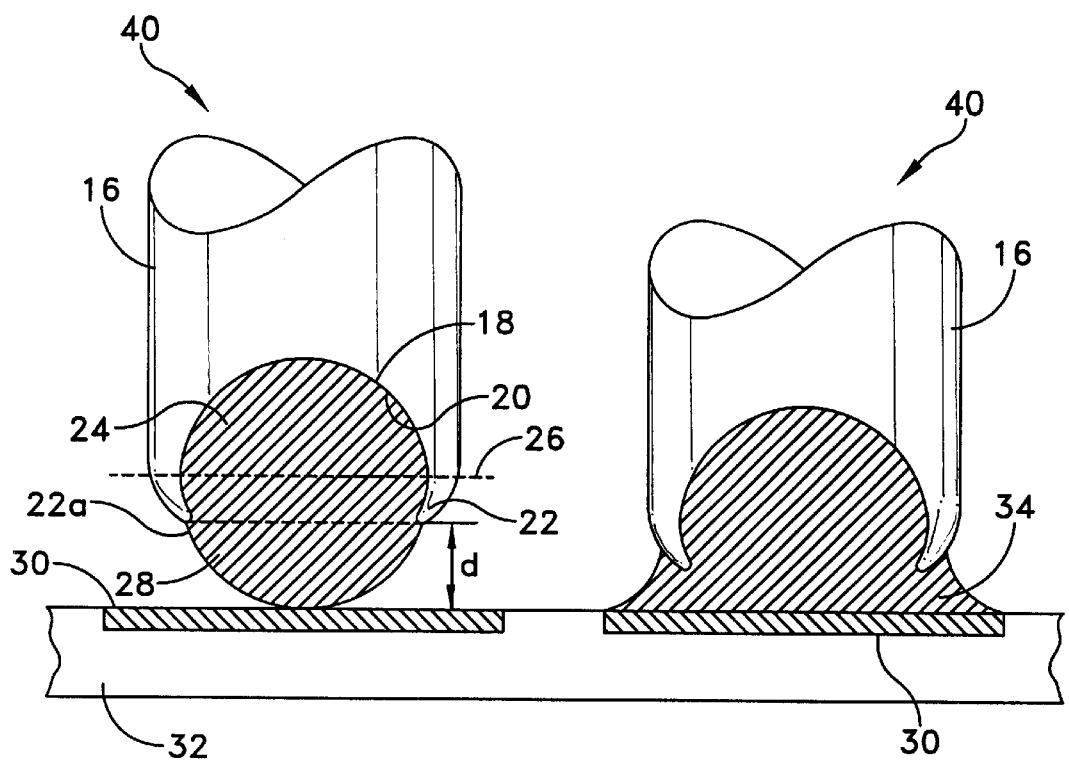
FIG. 3 is a partial view of the solder ball terminal of the FIG. 1, showing the placement of the solder ball on a mounting pad before and after the application of heat to the solder ball.

Referring now to FIG. 3, the method of attaching the solder ball terminal 10 to a substrate, or a mounting pad of a circuit board will be described. For simplicity, only the connection end or distal end 40 of the solder ball terminal 10 is shown in FIG. 3, including the head 16, socket 18, and the solder ball 24. As shown on the left side of the figure, prior to connection, the solder ball 24 is preferably brought into contact with a mounting pad 30 of the substrate, or circuit board 32. Due to the configuration of the terminal 10, as described above, the distance d between the tip 22a of the annular lip 22 and the mounting pad is approximately 0.008"–0.013", depending on the terminal and solder ball size, which may vary, as would be known to one of skill in the art. In addition, solder paste having a thickness of approximately 0.006" may also be utilized on the substrate. In such a case, the terminal comes even closer to the solder paste than the substrate alone.

Figure 8:
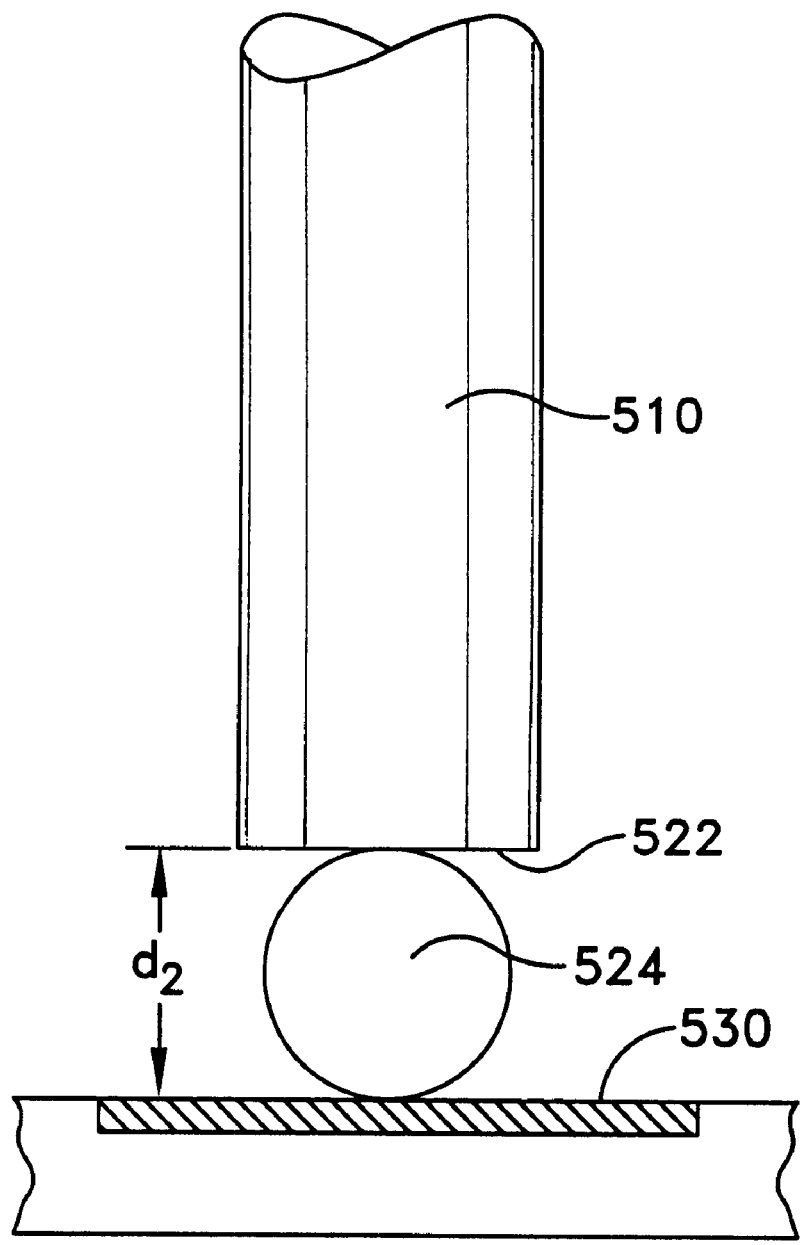
FIG. 8 is a schematic view of a solder ball terminal of the prior art.

In the prior art terminals described above, the head of the terminal is typically soldered to the top of the solder ball to adhere the solder ball to the terminal (see FIG. 8). This results in a distance ($d_2$) between the end of the terminal head 522 and the mounting pad 530 to be equal to approximately the diameter of the solder ball, or 0.030", in the case of the solder ball as described herein. The reduction of this distance by more than 50% by mounting the solder ball within socket 18 enables the terminal 10 to be connected with more precision and less chance of misalignment, since the solder ball terminal can be brought more than 50% closer to the mounting pad (with or without solder paste), for a more direct contact. In addition, because the terminal is twice as close to the mounting pad as prior art terminals, if the solder ball is not in direct contact with the pad, upon melting the solder will follow the flow of gravity toward the mounting pad, instead of toward the heat source (i.e. the terminal), and a connection will be made between the terminal and the circuit board.

Shown on the right side of FIG. 3 is the distal end 40 of the solder ball terminal 10 upon the application of heat to the solder ball 24. Once heat is applied, the solder ball melts, causing the terminal to move closer to the mounting pad 30. Since the original distance d is greatly reduced from the prior art, as discussed above, the terminal does not travel as far as prior art terminals before coming to rest on the solder mass 34, which is formed from the melted solder ball 24. As is known in the art, the amount of time that the solder is allowed to flow is precisely controlled so that the solder mass 34 does not run off of the mounting pad 30 into contact with adjacent mounting pads. Once the solder mass 34 cools, the terminal 10 is electrically connected to the circuit board 32 and mechanically secured due to the locking feature of the solder inside and outside the socket. The locking feature provides the terminal with improved mechanical security and electrical continuity as compared to prior art devices.

Figure 4:
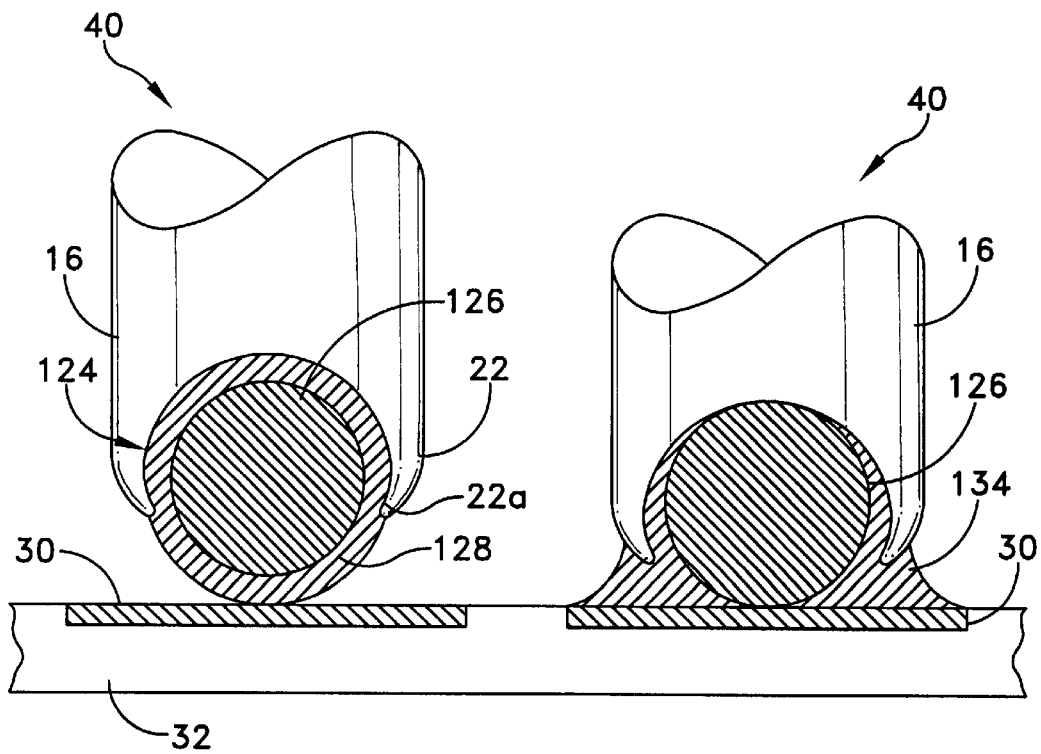
FIG. 4 is a partial view of the solder ball terminal of FIG. 1, showing the placement of the solder ball on a mounting pad before and after the application of heat to the solder ball, wherein the solder ball includes a solid core portion.

The solder ball terminal 10 may also be utilized with a solder ball 124 having an inner core 126 and an outer coating 128 (FIG. 4), such solder balls being known in the art. The outer core 128 is preferably formed from a typical solder material having a low melting temperature, and the inner core 126 is preferably formed from a solder material having a much higher melting point than the outer coating 128. In the embodiment of FIG. 4, the formation of the head 16 of the terminal, including the annular lip 22 and the tip 22a, is identical to the terminal 10 shown in FIG. 1. Shown on the right side of FIG. 4 is distal end 40 of the terminal 10 which has been attached to mounting pad 30 of the substrate or circuit board 32. As can be seen in the figure, upon heating of the solder ball 124, the outer coating 128 melts to form a solder mass 134, while the inner core 126 remains intact. Once the solder mass 134 is cooled, the terminal and the inner core 126 are electrically connected to the circuit board through the mounting pad 30.

Referring now to FIGS. 5–7, alternate embodiments of the solder ball terminal 10 are shown. In the embodiments of FIGS. 5, 6 and 7, all parts which are the same, or similar to, corresponding parts of the embodiment 10 (FIG. 1) are noted with the same two last numbers, but preceded by the numeral "1", "2" or "3", respectively.

The embodiment of the terminal 110 shown in FIG. 5 includes a head 116 having a socket 118 defined by a wall 120, and including an annular lip 122 having a tip 122a, as described above with respect to terminal 10 shown in FIG. 1. The body 112 of terminal 110, however, includes a male adapter 129 for connection to a socket, such as the socket 14 of terminal 10, or for connection to a through-hole on a printed circuit board (not shown). Thus, use of solder ball terminal 10 with connection socket 14 in combination with solder ball terminal 110 and adapter 129 allows a simultaneous connection to be made between a microprocessor chip and a printed circuit board, which reduces cost and the risk of damage to the system. Such terminals have particular application in surface mount circuit board connections. The body 112 may also include a barb portion 117 for anchoring the terminal in an insulating mount, as described above.

The embodiment of terminal 210 as shown in FIG. 6, likewise includes a head 216 having a socket 218 defined by a wall 220, and including an annular lip 222 having a tip 222a, as described above with respect to terminal 10 shown in FIG. 1. This embodiment does not, however, include a female socket at an end opposite the head 216. Instead, terminal 210 has a closed end 219 and preferably includes a knurl 221 circumscribing a portion of the body 212.

The embodiment of terminal 310, as shown in FIG. 7, includes a first or distal end 340 having a head 316 with a socket 318 defined by a wall 320, and including an annular lip 322 having a tip 322a, as described above with respect to terminal 10 shown in FIG. 1. The second or proximal end 350, is preferably identical to the distal end 340 and likewise includes a head 316b with a socket 318b defined by a wall 320b, and including an annular lip 322b having a tip 322c. The proximal end may be connected to the distal end by a stepped body portion 312. In this embodiment, the terminal may be attached for electrical connection at both ends, in the manner described above with reference to FIGS. 3 and 4.

While there is shown and described herein certain illustrative embodiments, it will be understood to those skilled in the art that various modifications and rearrangements of the parts may be made without departing from the spirit and scope of the underlying inventive concept. For example, it will be appreciated by those of skill in the art that while one end, i.e. the head, of the terminal according to the present invention includes a socket defined by a wall and including an annular lip having a outermost tip, the opposite end, i.e. body, may take any number of forms. Likewise, the body portion in all embodiments may include a barb, a knurl or other geometries, either alone or in combination, as would be known to those of skill in the art. In addition, the dimensions provided herein are not to be construed as limiting, but only as examples, and may be readily modified by one of skill in the art. Therefore, the above description should not be construed as limiting, but merely as exemplifications of an illustrative embodiment.

What is claimed is:

1. A solder ball terminal for making a solder-interconnection with a contact pad located adjacent to and in alignment with said terminal, said terminal comprising:

an elongated body portion having one end thereof adjacent the contact pad;

a substantially spherical connection socket at said one end of said body portion;

a solder ball;

said socket having means for mechanically gripping said solder ball to hold the latter in said socket without any fusion taking place between the ball and the socket and without any fusion existing between the ball and the contact pad;

said ball extending outwardly from said socket by a distance less than one-half the diameter of said ball, whereby melting of said solder ball results in effective and expeditious fusion between said one end of said body portion and the contact pad.

2. The solder ball terminal of claim 1 wherein the terminal edge of said connection socket comprises an annular lip, said lip comprising the aforesaid gripping means.

* * * * *